United States Patent [19]

Miyoshi et al.

[11] Patent Number: 5,293,045
[45] Date of Patent: Mar. 8, 1994

[54] ELECTROSTATIC LENS

[75] Inventors: Motosuke Miyoshi, Tokyo; Katsuya Okumura, Yokohama; Yuichiro Yamazaki, Tokyo, all of Japan

[73] Assignee: Kabushiki Kaisha Toshiba, Kawasaki, Japan

[21] Appl. No.: 988,701

[22] Filed: Dec. 10, 1992

[30] Foreign Application Priority Data

Jan. 13, 1992 [JP] Japan .................................. 4-3849

[51] Int. Cl.⁵ ............................................. H01J 37/12
[52] U.S. Cl. .................................. 250/396 R; 250/398
[58] Field of Search .......................... 250/396 R, 398; 313/361.1

[56] References Cited

U.S. PATENT DOCUMENTS 4,710,632 12/1987 Ishitani et al. .................. 250/356 R
4,835,399 5/1989 Hosaka et al. ................... 250/356 R
5,159,170 10/1992 Levin ............................. 250/505.1

OTHER PUBLICATIONS

M. Szilagyi and L. Szep, "Optimum design of electrostatic lenses", J. Vac. Sci. Technol., B6(3), May/Jun. 1988, pp. 953–957.

*Primary Examiner*—Bruce C. Anderson
*Attorney, Agent, or Firm*—Foley & Lardner

[57] ABSTRACT

An electrostatic lens having at least three electrodes and an insulating holder for holding the electrodes, the inner wall of the holder being coated with a silicone carbide film. The silicone carbide film may be formed by means of a vapor deposition method. The energy of an electron beam is set to 1.5 keV or lower. The silicone carbide film may be added with an additive for controlling the electric conductivity of the silicone carbide film. The additive may be nitrogen.

9 Claims, 5 Drawing Sheets

ELECTROSTATIC LENS

BACKGROUND OF THE INVENTION

The present invention relates to an electrostatic lens for electron microscopes, focussed ion beam apparatuses, or the like.

Electrostatic lenses have been used as focussing lenses for electron guns, focussed ion beam apparatuses, or the like. In place of an electromagnetic lens of an electron microscope, an electrostatic lens is expected to be used as a focussing lens for apparatuses using electron beams, particularly for semiconductor device inspecting apparatus. The reason for this is that electrostatic lenses can be made compact and light, and in addition, an improved aberration characteristics in the low acceleration voltage range can be expected.

The aberration characteristics in the low acceleration voltage range are required to be improved because it is necessary for semiconductor devices to be protected from damage by electron bombardment and it is necessary to prevent electric charges from being accumulated.

Electrostatic lenses have to meet the following requirements.

First, it is necessary to reduce the accumulation of electric charge. Within the structure of an electrostatic lens assembly, there exist not only electrons passing through a normal orbit along the optical axis, but also stray electrons dispersed by an aperture and the like. These stray electrons are piled up on the inner wall of a holder and charge it up. Therefore, an electric field which should not be otherwise present is generated, lowering the focussing effects of the lens and making the electron orbit unstable.

This phenomenon becomes particularly conspicuous when the energy of electrons is low. Many electrostatic lenses are being used to inspect semiconductor devices. In order to not damage semiconductor devices during inspection, it is necessary to use electrons of a low energy and solve the problem of electric charge accumulation.

Secondly, it is necessary that a holder for holding a lens should not contaminate specimens. In many cases, as the holder material, material generally called machinable ceramic having good machinability is used.

However, this machinable ceramic has many impurities. These impurities are emitted in the form of gas within the vacuumed holder, and attach to a specimen and contaminate it. Generally the holder is baked in order to raise the degree of vacuum. Therefore, the phenomenon of gas emission of impurities is accelerated. As described above, an electrostatic lens is often used in inspecting semiconductor specimens, and so such contamination poses a significant problem.

Thirdly, it is necessary to reduce the optical aberration of a lens. The most important parameter in evaluating the lens performance is an aberration coefficient. An aberration of an electrostatic lens generates locally, and the aberration at this local area determines the whole lens performance.

It has been proposed to smooth a potential change by using a number of lens electrodes and applying voltages having a small difference therebetween to the lens electrodes (Reference Document: M. Szilagyi and L. Szep, "Optimum design of electrostatic lenses", J. Vac. Sci. Technol., B6(3), May/June 1988, pp. 953-957).

However, use of a number of lenses increases the number of electrodes. The lens assembly described in the above Document uses twelve electrodes. There arises the problem of a complicated structure, increased manufacturing cost, and poor utility.

It has been also considered to use a lens of a larger inner diameter to smooth the potential change. However, with a large inner diameter, the outer dimension of an electron optical barrel becomes large, which is quite a disadvantage from the viewpoint of an object of using an electrostatic lens which is essentially smaller than a conventional electromagnetic lens.

SUMMARY OF THE INVENTION

It is therefore an object of the present invention to provide an electrostatic lens capable of reducing electric charge accumulation, preventing specimen contamination, and improving optical aberration.

According to the present invention, there is provided an electrostatic lens having at least three electrodes and an electrically insulated holder for holding the electrodes in an inner wall, the inner wall of the holder being covered with an SiC film.

The SiC film covering the holder inner wall hardly contains impurities, and is resistant to high temperature baking. Specimens are therefore prevented from being contaminated by impurities. The SiC film is conductive while presenting a high electrical resistance. Therefore, stray electrons will not accumulate on the holder inner wall, thereby avoiding electric charge accumulation and stabilizing an electron orbit. Furthermore, electrodes become interconnected by high resistances, providing a smooth potential distribution and an improved aberration.

If an SiC film is formed by means of a chemical vapor deposition method, it is possible to prevent impurities such as heavy metals from being contained in the film, and it is possible to prevent impurities within the base of the holder from being diffused to the outside even if the holder is placed for a long time under a high temperature condition.

If an additive for controlling the conductivity of the SiC film is added to the film, it is possible to change the potential distribution between electrodes to a desired slope, the potential distribution affecting the spherical aberration.

It has been found that a semiconductor device used as an inspection specimen will not be damaged when the electron energy is set to 1.5 KeV.

DESCRIPTION OF THE PREFERRED EMBODIMENTS

Embodiments of the present invention will be described with reference to the accompanying drawings.

Figure 1:
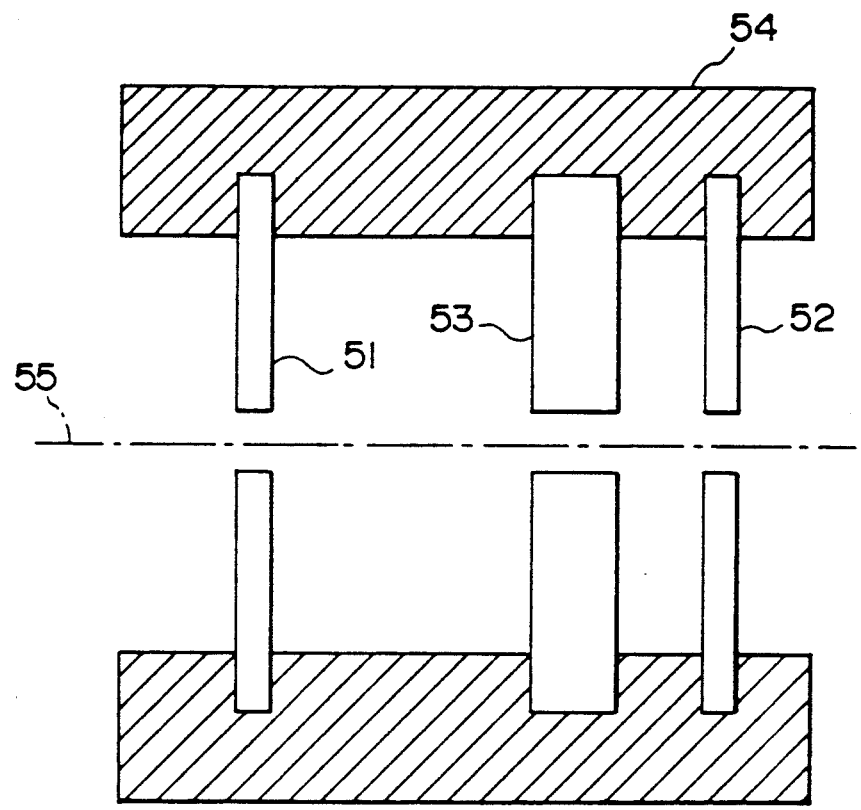
FIG. 1 is a cross sectional view in elevation showing the structure of an electrostatic lens according to a first embodiment of the present invention.

An electrostatic lens of the first embodiment has the cross sectional structure such as shown in FIG. 1. This lens having such a structure is generally called an Einzel lens. A cylindrical holder 54 for holding electrodes is made of ceramic which is an insulating material. An electrode 51, lens electrode 53, and electrode 52 respectively of a disk shape or cylindrical tube shape are mounted on the inner wall of the holder 54. The electrodes 51 and 52 are set to a ground potential, and the lens electrode 53 is set to a negative potential to generate an electrical field and focus an electron beam. A cathode 55 aligned along the optical axis of the lenses 51 to 53 is biased to a negative potential corresponding to an acceleration voltage, e.g., $-1$ kV for the acceleration voltage 1 kV.

The spherical aberration coefficient is expressed by the following equation (1), and the chromatic aberration coefficient is expressed by the following equation (2).

$$C_s = \frac{1}{16\sqrt{V(z_o)}} \int_{z_o}^{z_i} \left\{ \left[ \frac{5}{4}\left(\frac{V''}{V}\right)^2 + \frac{5}{24}\left(\frac{V'}{V}\right)^4 \right] r_a^4 + \frac{14}{3}\left(\frac{V'}{V}\right)^3 r_a' r_a^3 - \frac{3}{2}\left(\frac{V'}{V}\right)^2 r_a'^2 r_a^2 \right\} \sqrt{V} dz \quad (1)$$

$$C_c = \sqrt{V(z_o)} \int_{z_o}^{z_i} \left( \frac{1}{2} \frac{V'}{V} r_a' + \frac{1}{4} \frac{V''}{V} r_a \right) \frac{r_a}{\sqrt{V}} dz \quad (2)$$

where $z_o$ and $z_i$ represent the positions of an object and an image along the Z-axis (central optical axis), $r_a$ represents a paraxial orbit, V represents a potential distribution on the Z-axis, and $V'$ and $V''$ represent first and second order differentials.

Figure 2:
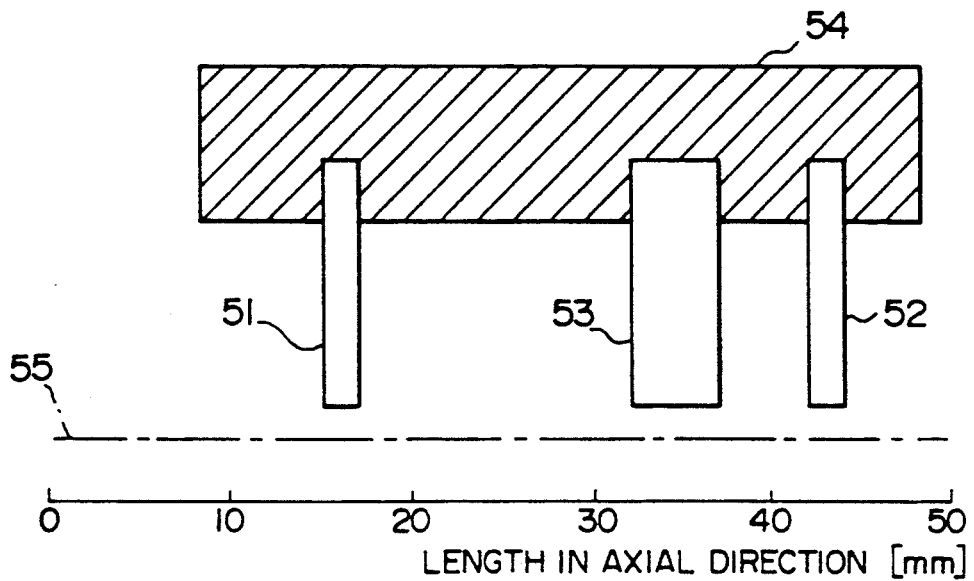
FIG. 2 is a cross sectional view in elevation showing the structure of the electrostatic lens shown in FIG. 1 as referenced to the length in the axial direction.
Figure 3:
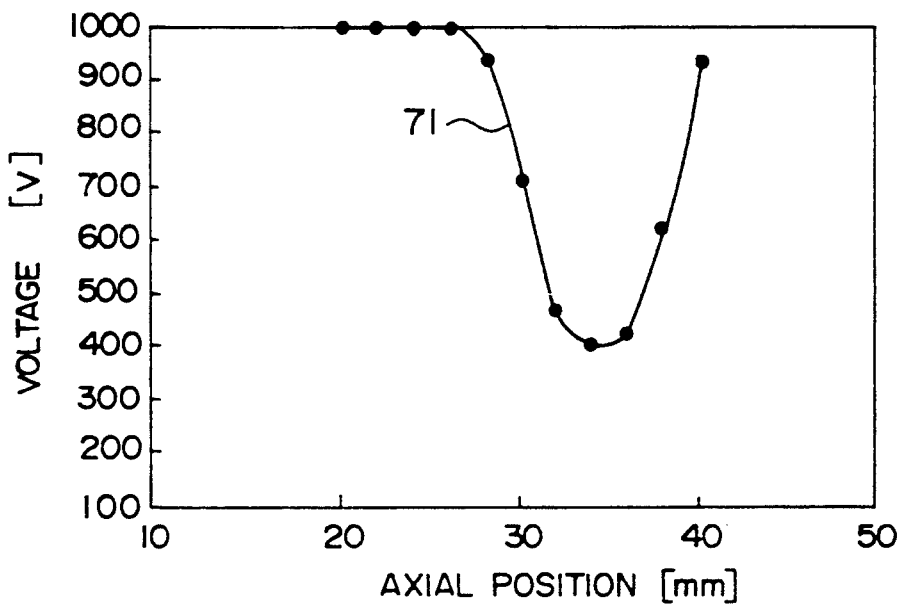
FIG. 3 is a graph showing the potential distribution of the electrostatic lens shown in FIG. 1 along the central optical axis.

As seen from the equations (1) and (2), for the large value of the first order potential difference $V'$, both the spherical and chromatic aberration coefficients become large. This relationship is illustrated in FIGS. 2 and 3. FIG. 2 shows the holder 54 and electrodes 51 to 53 relative to the length in the axial direction, and FIG. 3 shows a change in the voltage in the axial direction. For this graph, it was assumed that the electrodes 51 and 52 are set to the ground potential, the lens electrode 53 is set to $-811$ V, and the cathode 55 is set to $-1$ kV. The focal length is 73 mm, and the magnification factor is 1.1. Under these conditions, the spherical aberration coefficient Csi is 18588 mm, and the chromatic aberration coefficient Cci is 230 mm.

Figure 4:
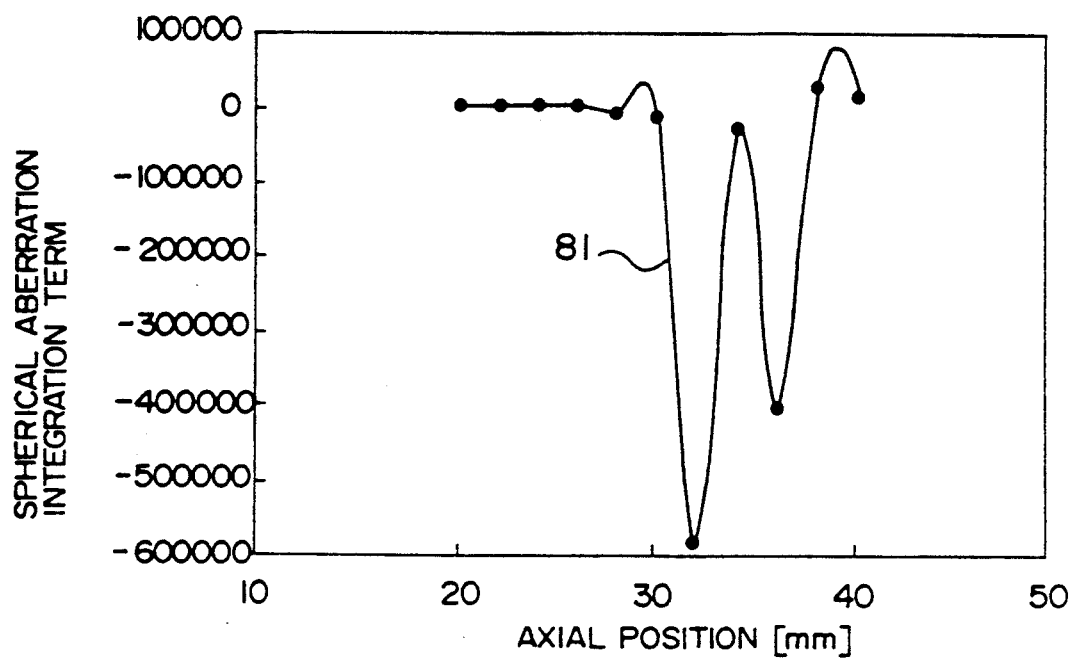
FIG. 4 is a graph showing the distribution of the value of the spherical aberration integration term of the electrostatic lens shown in FIG. 1 along the central optical axis.
Figure 5:
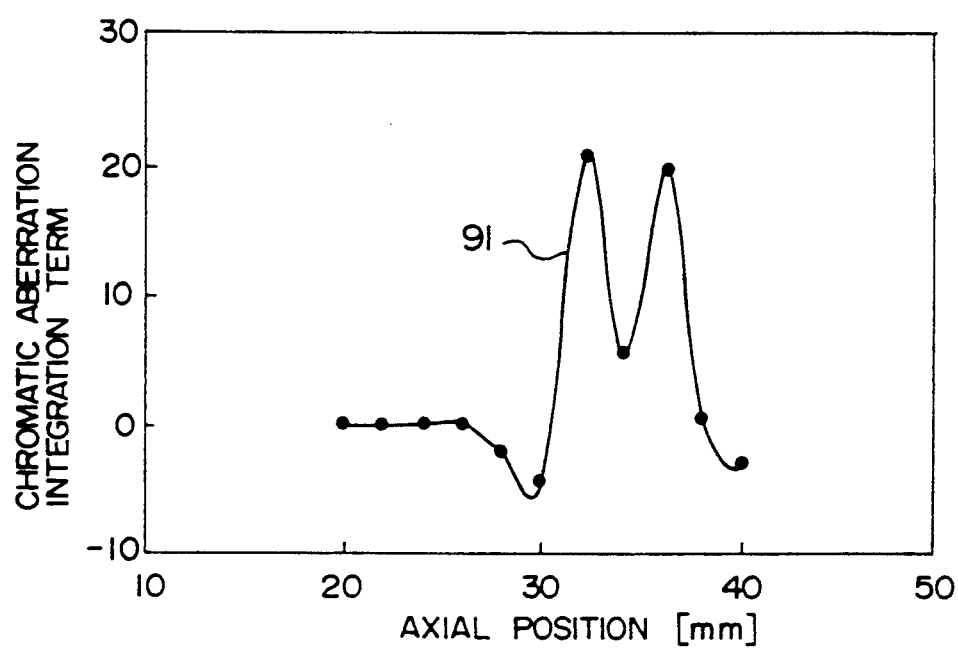
FIG. 5 is a graph showing the distribution of the value of the chromatic aberration integration term of the electrostatic lens shown in FIG. 1 along the central optical axis.

As seen from the equations (1) and (2), the position where the value of the integration term becomes large, corresponds to the position where an aberration generates. The position where the value of the integration term becomes large, is the position where the potential change is large. As shown in FIG. 4, the position where the absolute value of the spherical aberration integration term in the equation (1) becomes maximum, is the same as the position where the potential change is maximum. Similarly, as shown in FIG. 5, the value of the chromatic aberration integration term in the equation (2) becomes maximum at the position where the potential change is maximum. This means that a lens having the structure allowing an abrupt change in the potential generates an aberration at such an abrupt change position, deteriorating the total lens characteristics.

Figure 6:
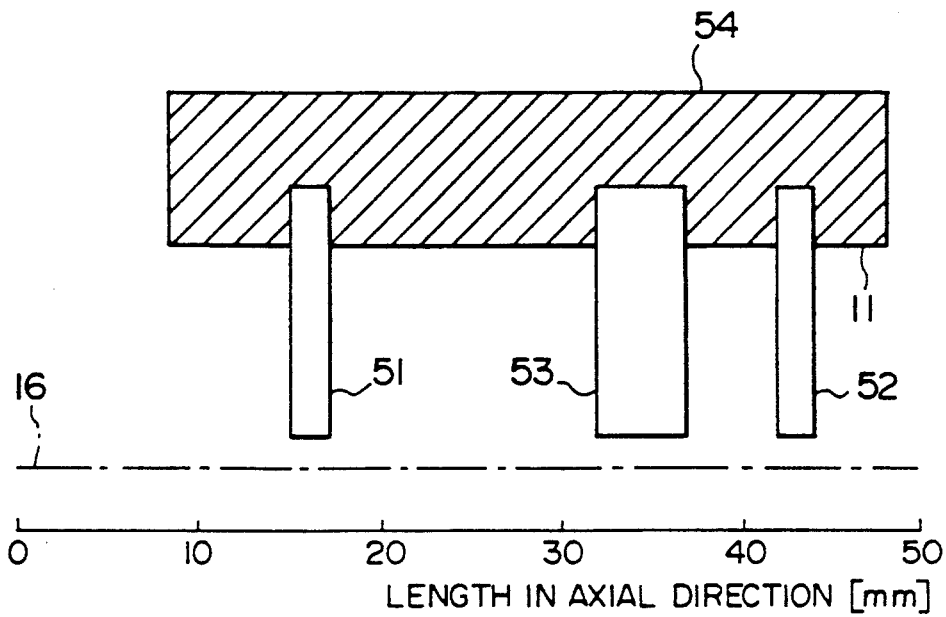
FIG. 6 is a cross sectional view in elevation showing the structure of an electrostatic lens according to a second embodiment of the present invention.

The cross sectional structure of an electrostatic lens of the second embodiment is shown in FIG. 6. Similar to the electrostatic lens of the first embodiment shown in FIG. 1, grounded electrodes 51 and 52 and a lens electrode 53 are supported by a holder 54. The lens electrode 53 is applied with a negative voltage, e.g., $-900$ V in order to generate a lens electrical field.

The holder 54 is made of insulating machinable ceramic worked into a cylindrical shape. The inner wall of the holder 54 is coated with silicone carbide (hereinafter called SiC) to form a SiC film 11 having a thickness of about 10 $\mu$m. This film coating is achieved by a chemical vapor deposition (CVD) method for example.

SiC can be obtained by thermally decomposing silane chloride ($(CH_3)SiCl_3$). A SiC film 11 made by the CVD method scarcely contains impurity elements including alkaline metal such as Na and K, heavy metal such as Fe, or the like, which are impurity elements which may damage semiconductor devices. The measurement of the impurity concentrations of the SiC film 11 showed 2 ppb or less Na, 60 ppb or less K, and 35 ppb or less Fe.

The SiC film 11 itself scarcely contains the above impurities. Consequently, no impurity gas will be emitted from the SiC film 11.

Furthermore, the SiC film 11 is highly resistant to heat, and can be resistant even to high temperatures while the holder 54 is baked. The SiC film 11 has a function to block the emission of gas and impurities out of the machinable ceramic underlying the film, even if the film 11 is placed for a long time under a high temperature condition. For example, the measurement of the Fe impurity diffusion coefficient was $6.5 \times 10^{-16}$ $m^2/s$ at 1300° C.

The SiC film 11 is conductive while presenting a high electric resistance. The resistance value is about 100 k ohm-cm. Since the holder 54 inner wall is conductive, stray electrons will not accumulate, thereby preventing electric charge accumulation. In addition, the electrodes 51 to 53 are resultantly interconnected by high resistances, providing a smooth potential distribution between the electrodes 51 to 53 and hence suppressing an aberration. It is also possible to control the resistance value of the SiC film 11. For example, the resistance value of the SiC film 11 changes by adding a small amount of nitrogen when forming the film 11 by a CVD method. By changing the amount of nitrogen to be added, the resistance value of the SiC film 11 can be set to a desired value.

Figure 7:
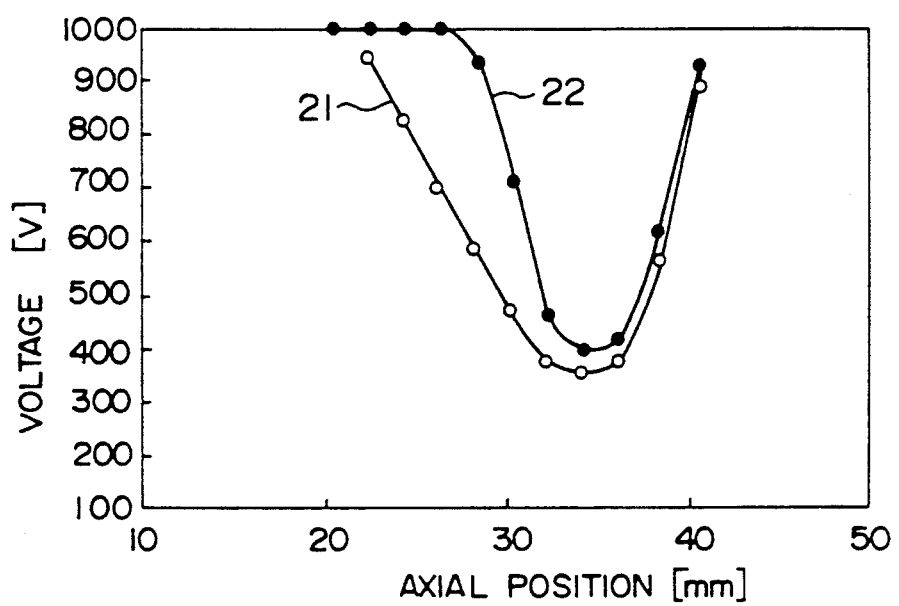
FIG. 7 is a graph showing the potential distribution of the electrostatic lens shown in FIG. 6 along the central optical axis.

The simulation result of the potential distribution of the electrostatic lens of the second embodiment along the central axis is shown by the solid line 21 in FIG. 7. This simulation calculation was performed on the assumption that the electrodes 51 and 52 are set to the ground potential, the lens electrode 53 is set to +100 V, and the cathode 16 is set to 0 V. The focal length is 73 mm, and the magnification factor is 1.1. These conditions are identical to those of the electrostatic lens of the first embodiment. The potential distribution of the electrostatic lens of the first embodiment described with FIG. 3 is given by the solid line 22 in FIG. 7. It is to be noted that in the potential distribution of the second embodiment, the slope of the electric field generated by the lens electrode 53 becomes smoother than that of the first embodiment.

Figure 8:
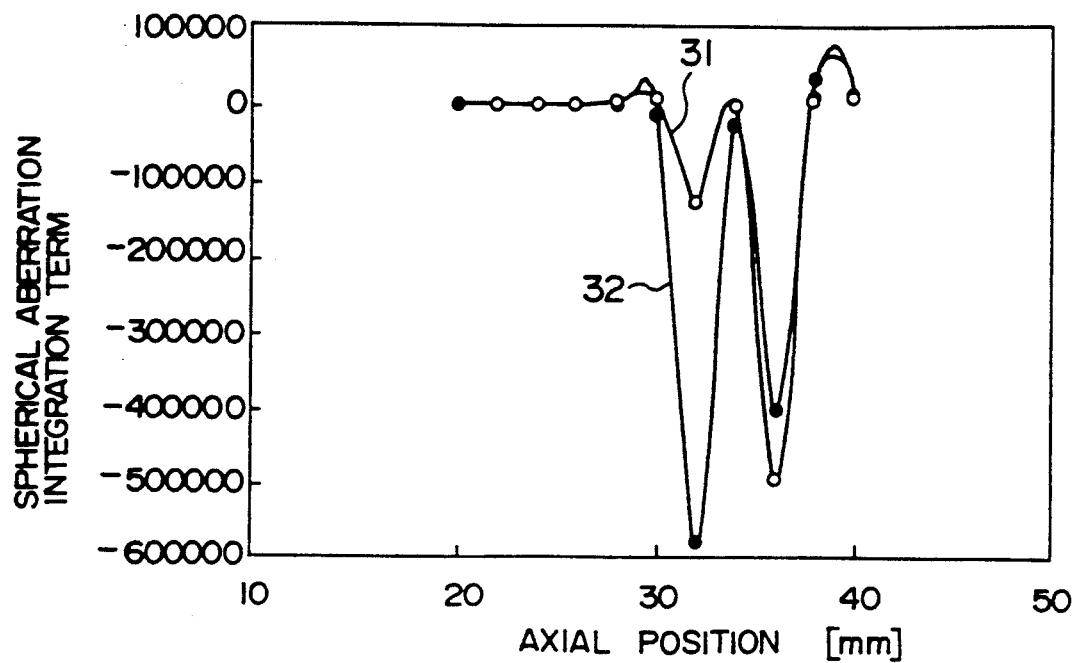
FIG. 8 is a graph showing the distribution of the value of the spherical aberration integration term of the electrostatic lens shown in FIG. 6 along the central optical axis.
Figure 9:
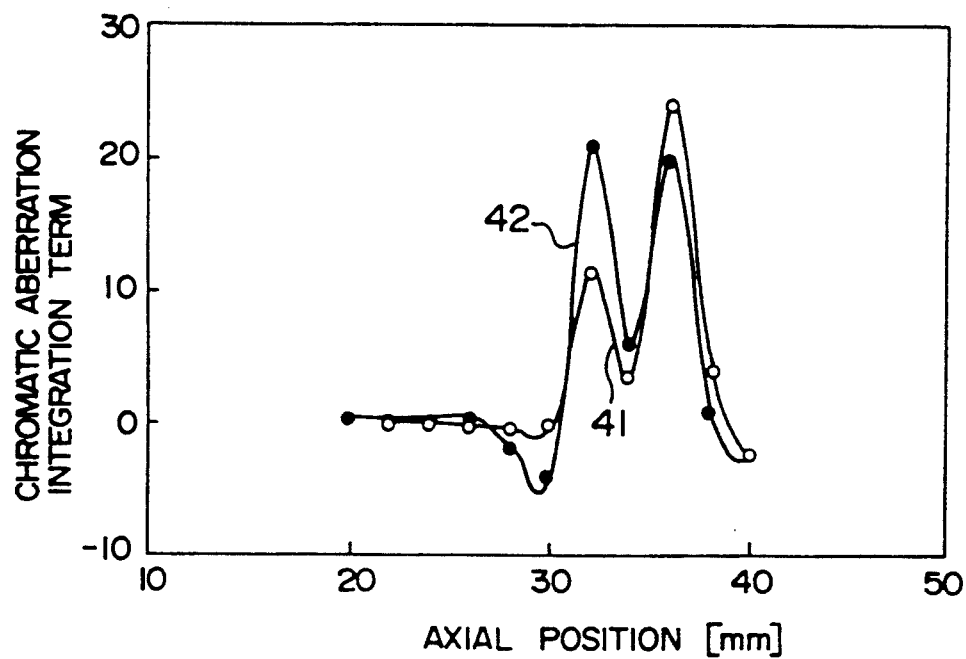
FIG. 9 is a graph showing the distribution of the value of the chromatic aberration integration term of the electrostatic lens shown in FIG. 6 along the central optical axis.

FIGS. 8 and 9 show the comparison results of the spherical and chromatic aberration integration terms between the electrostatic lenses of the first and second embodiments. The value of the spherical aberration integration term of the second embodiment is shown by the solid line 31 of FIG. 8. The value of the chromatic aberration integration term of the electrostatic lens of the second embodiment is shown by the solid line 41 of FIG. 9, and that of the first embodiment is shown by the solid line 42 of FIG. 9. As seen from FIG. 8, the peak value of the spherical aberration integration term of the second embodiment is reduced more than in the first embodiment. This reduction of the peak results from a smooth electric field distribution at the area between the electrodes 51 and 53. It is also understood from FIG. 9 that the peak value of the chromatic aberration integration term of the second embodiment reduces more than the first embodiment, although not so much as the spherical aberration integration term.

The calculated result of the spherical aberration Csi on the image side of the second embodiment was 16280 mm, and that of the chromatic aberration Cci was 242 mm. For the electrostatic lens of the first embodiment, the spherical aberration Csi was 18588 mm and the chromatic aberration Cci was 230 mm. The second embodiment reduces the spherical aberration by about 12%, and increases the chromatic aberration by about 5%. In overall comparison, the second embodiment reduces the aberration more than the first embodiment. The reason for the better result of reducing the spherical aberration is that the spherical aberration greatly depends upon the slope of the potential distribution. On the contrary, the chromatic aberration does not necessarily depend upon the potential distribution.

As described so far, the holder inner wall of an electrostatic lens of the present invention is coated with a SiC film. Therefore, it is possible to prevent a specimen to be contaminated by impurities, and the conductive SiC film of a high electric resistance prevents stray electrons from piling up and charging up the film, and stabilizing an electron orbit. Furthermore, since the electrodes become interconnected by a high resistance SiC film, a smooth potential distribution is obtained and the aberration is improved.

The above embodiments have been described only by way of example, and are not intended to limit the scope of the present invention. For example, the number of electrodes may be more than three, and the SiC film may be formed by other methods different from a CVD method so long as they can coat the holder inner wall with SiC.

What is claimed is:

1. An electrostatic lens comprising:
   at least three electrodes; and
   an insulating holder for holding said at least three electrodes in an inner wall, the inner wall of said holder being coated with a silicone carbide film.

2. An electrostatic lens according to claim 1, wherein said silicone carbide film is formed on the inner wall of said holder by means of a vapor deposition method.

3. An electrostatic lens according to claim 2, wherein said silicone carbide film is added with an additive for controlling the electric conductivity of said silicone carbide film.

4. An electrostatic lens according to claim 3, wherein said additive is nitrogen.

5. An electrostatic lens according to claim 4, wherein the energy of an electron beam is set to 1.5 keV or lower.

6. An electrostatic lens according to claim 3, wherein the energy of an electron beam is set to 1.5 keV or lower.

7. An electrostatic lens according to claim 1, wherein the energy of an electron beam is set to 1.5 keV or lower.

8. An electrostatic lens according to claim 1, wherein said silicone carbide film is added with an additive for controlling the electric conductivity of said silicone carbide film.

9. An electrostatic lens according to claim 8, wherein said additive is nitrogen.

* * * * *